United States Patent [19]

Richards et al.

[11] Patent Number: 4,610,019
[45] Date of Patent: Sep. 2, 1986

[54] ENERGIZING ARRANGEMENT FOR CHARGE COUPLED DEVICE CONTROL ELECTRODES

[75] Inventors: Ernie Richards, Cincinnati, Ohio; Nathan Bluzer, Silver Spring, Md.

[73] Assignee: The United States of America as represented by the Secretary of the Air Force, Washington, D.C.

[21] Appl. No.: 664,197

[22] Filed: Oct. 24, 1984

[51] Int. Cl.⁴ .................. G11C 27/04; H01L 29/76
[52] U.S. Cl. ................................. 377/58; 377/60; 377/62; 328/56
[58] Field of Search ............... 377/58, 60, 61, 62, 377/63, 127, 128, 70, 76, 79; 328/55, 56

[56] References Cited

U.S. PATENT DOCUMENTS

| | | | |
|---|---|---|---|
| 3,502,991 | 3/1970 | Sampson | 328/56 |
| 3,651,349 | 3/1972 | Kahng et al. | 377/63 |
| 3,725,790 | 4/1973 | Ault et al. | 377/79 |
| 3,819,954 | 6/1974 | Butler et al. | 377/58 |
| 4,344,001 | 8/1982 | Tsuchiya et al. | 377/60 |
| 4,393,357 | 7/1983 | Linnenbrink et al. | 333/165 |
| 4,443,766 | 4/1984 | Belton | 328/56 |

Primary Examiner—John S. Heyman
Attorney, Agent, or Firm—Donald J. Singer; Gerald B. Hollins

[57] ABSTRACT

A charge coupled device gate electrode bus driving arrangement which uses the properties of an electrical transmission line to achieve higher impedance, essentially reactive free, loading of the bus driver circuit is disclosed. The described arrangement includes the addition of inductance elements, resistive terminations, constant gate capacitance compensation, and delay line considered placement of the CCD cells to the usual CCD configuration; the disclosure includes numeric examples of the impedances and delay times achieved.

4 Claims, 4 Drawing Figures

ENERGIZING ARRANGEMENT FOR CHARGE COUPLED DEVICE CONTROL ELECTRODES

RIGHTS OF THE GOVERNMENT

The invention described herein may be manufactured and used by or for the Government of the United States for all governmental purposes without the payment of any royalty.

BACKGROUND OF THE INVENTION

This invention relates to the field of semiconductor charge transfer devices and to the conveyance of signals between the control gate elements of such devices.

Charge coupled devices (CCD's) and Bucket Brigade devices (BBD's) are two forms of Charge transfer devices (CTD's). Charge coupled devices are frequently used for storing data, for transforming data from an optical image to an electrical signal and for reorganizing data from, for example, a serial format into a parallel format, and thence into a second serial format. Although parallel readout of the data stored in individual cells of a CCD array may be required in some applications, serial readout is also often required and in many instances is essential to use of the CCD concept. In the optical-to-electrical signal transducer application of a CCD, for example, an image may be impressed on an array of CCD's which are subsequently interrogated in some organized serial fashion in preparation for storing or processing the image related information.

Serial readout is a time-consuming operation involving numerous repetitions of a shift and read sequence, and in view of these numerous repetitions, there is great incentive to minimize the time required for each event included in a read cycle. Since CCD arrays capable of operation at frequencies of 1 gigahertz and above are now possible, read cycle event times in the order of fractions of nanosecond are required.

A major limiting consideration in the serial operation of CCD arrays in this speed range has concerned the currents required for driving the gate electrodes of the array and the circuitry and power consumption involved in the gate electrode drivers. For example, a CCD array which operates with 10 volt signal swings at the control gate, and has a total of 100 picofarads of gate capacitance, involves voltage change rates on the order of 20,000 volts per microsecond and current changes in the order of 4 amperes per nanosecond, or 2 amperes per half nanosecond with conventional driving of the array.

Because of these current levels and the resulting power dissipation in a gate driving circuit, it is common practice in such high-speed CCD arrays to locate the gate driving circuit external to the CCD microcircuit chip where the generated heat can be dissipated without effect on the performance or the size of the package required for the CCD array. The high speed current change however makes such coupling of drive signals from off chip to the CCD array difficult because the inductance of signal coupling bond wire is about 40 Nanohenrys per inch of length and the voltage developed across such as inductance is determined by the mathematical product of inductance and current rate of change (L di/dt). The expected current change rate of $4 \times 10^9$ amps/second therefore produces a bond wire voltage drop of 1.6 volts per 1/100 inch of bondwire length—an unacceptable value in most circuit arrangements.

The present invention provides an alternative arrangement for driving the control gate electrodes and similar busses in large arrays and provides more reasonable and more easily attained driving current magnitudes. Use of the invention may in CCD arrays therefore allow consideration of returning the driving circuit to the microcircuit chip.

The invention involves use of inductive elements distributed in a particular configuration in a CCD array; distributed inductive elements have of course been used in the electrical arts for such diverse purposes as compensating for the resistive-capacitive rolloff in telephone lines, a use proposed by Oliver Heavyside, and for transmission line coupling between stages of a distributed amplifier in oscilloscope equipment, and for numerous other uses.

The patent art includes several examples of CTD gate electrode driving arrangements; these examples include the patent of Walter J. Butler et al, U.S. Pat. No. 3,819,954, which addresses the problem of signal level change occurring as a given input signal propagates through the stages of a CCD or BBD device. The Butler patent is principally concerned with the amplitude of the signal being propagated through the CTD stages.

Another example of the patent art relating to CTD devices is found in the patent of Takao Tsuchiya et al, U.S. Pat. No. 4,344,001 which concerns a clock driving circuit and a signal output circuit for a charge transfer device of either the BBD or the CCD type. The circuit invention of the Tsuchiya patent is concerned with the above-described problems of driving a clock bus or gate electrode bus in a CCD array and resolves these problems by way of providing an improved driving circuit.

Another example of CCD arrangements is found in the patent of Thomas E. Linnenbrink, U.S. Pat. No. 4,393,357 which is concerned with a CCD employed for high-speed data recording and involves the arrangement used for transferring charge between cells in a CCD. The Linnenbrink patent uses a first transmission line for coupling received signals into the charge transfer device structure and also for accomplishing the readout of stored signals. The Linnenbrink apparatus also uses electrostatic coupling between the transmission line and the charge device structure. Both the use of this electric field coupling between the line and charge device structures and the employment of the transmission lines for signals other than the cell-to-cell transfer clock distinguish the Linnenbrink apparatus from the present invention. Other differences in the Linnenbrink disclosure and the present invention include use of a "cutter gate" by Linnenbrink and the absence of large capacitance loading as provided by the control gate element capacitances in the Linnenbrink apparatus.

SUMMARY OF THE INVENTION

An object of the present invention is to provide a bus driving arrangement which reduces the capacitance loading imposed on a driving circuit.

Another object of the invention is to provide a CTD arrangement which benefits from transmission line coupling of charge transfer signals to the successive CTD elements.

Another object of the invention is to provide a CCD arrangement wherein the effects of varying gate electrode capacitance is compensated in order that the gate capacitance be usable as a component of a delay line.

These improvements are achieved by providing a charge coupled across the face of an integrated circuit chip. Each of the cells has a gate electrode and an adjacent semiconductor depletion region potential well area and the cells are arranged in a cell output-to-cell input ordered serial sequence capable of propagating received input signal transitions incrementally between cells in shift register fashion—in response to periodic clock signal transitions received at the gate electrode of each cell. The apparatus includes also a source of periodic transition clock signals coupled to a signal node on the integrated circuit chip; transmission line apparatus extending across the face of the integrated circuit chip and connecting with the signal node and the respective gate electrodes. The transmission line apparatus includes a plurality of electrical inductance elements electrically located between successive gate elements in the cell serial sequence and comprising in combination with the electrical gate capacitance of the gate electrodes, a signal transmission line of characteristic impedance Z; the apparatus also includes an electrical resistance means for terminating the transmission line in its characteristic impedance.

Although much of the description herein is phrased in terms of CCD structure, it will be understood that BBD's and other CTD arrangements are sufficiently similar to be included and that the CCD language is therefore not to be interpreted as a limitation of the disclosure or the claims.

DETAILED DESCRIPTION

A common difficulty encountered in achieving high-speed operation of large CTD arrays is exemplified by the typical current values of 4 amps per nanosecond experienced in driving a 400 picofarad gate bus capacitance at 10 volts of signal swing in the CCD array described above. The provision of gate bus driving circuitry capable of operation in this range of speed and current is cumbersome, expensive, and encumbered by state-of-the-art limitations in driving circuit components. The nature of this requirement is evidenced by the driving circuit invention described in the above-referenced U.S. Pat. No. 4,344,001 of Takao Tsuchiya et al. The general desirability of employing transmission line concepts in CCD structures is moreover evidenced by the additional above-referenced U.S. Pat. No. 4,393,357 of Thomas E. Linnenbrink et al, the disclosure of which is hereby incorporated by reference into the present document.

A significant decrease in the apparent capacitance load presented by the gate electrode bus of a CCD array, for example, can be realized by configuring the gate bus into the form of an electrical transmission line. In a transmission line CCD gate configuration for a 10-volts clock swing, typically the 4 amps per nanosecond current drive indicated above, can be reduced to currents on the order of 0.2 amps per nanosecond—assuming a 50 ohm transmission line characteristic impedance. Currents in this range, an order of magnitude decreased from the previously required values, are much more easily provided by MOS or bipolar or other transistor devices. Furthermore, the input impedance of such a CCD configuration is real and not completely reactive as is the case with a normally driven capacitive gate. Thus impedance matching between a driver circuit and a CCD array can be more readily achieved.

Arrangement of CCD cell gate electrodes into such a transmission line configuration can of course result in an out-of-phase relationship between the signals located at widely separated points of the CCD array geometry. Such phase differences are largely the result of signal delays, i.e., delay line properties, inherent in the operation of a transmission line. As is described below, however, the magnitude of these delays can be arranged to be small enough to enable proper local timing of gate electrode signals, that is, the attainment of essentially correct timing between signals applied to the CCD cell preceding and succeeding any designated cell within a local area of a CCD.

The attainment of correct local area timing between cells of a CCD in an integrated circuit chip also presumes of course that the successive cells of the CCD array are arranged in some orderly placement which makes the respective delay line nodes in the CCD array conveniently accessible as needed.

Figure 1:
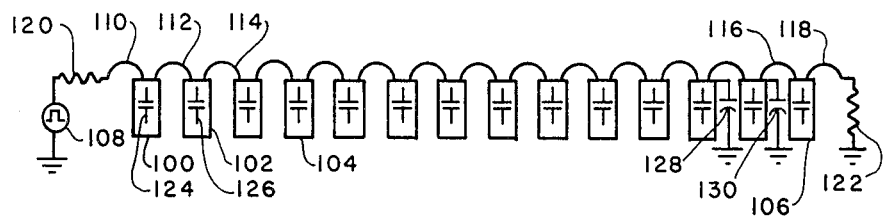
FIG. 1 is an electrical schematic representation of a transmission line coupled gate bus for a CCD array.

A schematic diagram illustrating the desired electrical arrangement of the CCD gate elements for achieving the benefits of transmission line characteristics in driving the gates, is shown in FIG. 1 of the drawings. In the FIG. 1 drawing the CCD gate electrodes are indicated at 100, 102, 104, and 106 and the capacitive nature of these gate elements is indicated typically at 124 and 126.

In order that these capacitive-appearing CCD gates comprise elements of an electrical transmission line the invention contemplates the incorporation of certain additional components into the FIG. 1 schematic diagram and of course the physical location of successive gate electrodes in some progressive geometric order as indicated above. The added components, for transmission line operation, the inductance elements 110, 112, 114, 116 and 118, and the terminating resistances 120 and 122, when selected to have appropriate electrical values, can comprise a transmission line having a nonreactive or resistive characteristic impedance—a much more readily driven electrical load that the load encountered by driving a conventional CCD where the load is capacitive because of the parallel connection of electrodes 100-106 from the CCD gates.

The characteristic impedance of a FIG. 1 type transmission line is predicted mathematically by the equation:

$$Z_{in} = Z_{out} = \frac{L}{C}^{\frac{1}{2}}$$

where L is the electrical inductance of one of the elements 110-118 and C is the electrical capacitance of one gate electrode element 100-106, the capacitance indicated by the capacitors 124 and 126. As is known in the transmission line art, the above equation presumes the frequency of interest to be less than $(LC)^{-\frac{1}{2}}$.

The values of L and C attainable in an integrated circuit CCD device can, according to this equation, reasonably provide transmission line characteristic impedance values between 10 and 100 ohms. If a source of pulses 108 in FIG. 1 has an internal impedance near zero ohms, each of the terminating resistance elements 120 and 122 in FIG. 1 can correspondingly be selected to have a resistance equaling this characteristic impedance of the transmission line.

As indicated by an examination of the above mathematical equation for characteristic impedance and in view of required CCD gate electrode signal swings, it is desirable in an embodiment of the FIG. 1 apparatus to make the newly-added inductive elements, that is, the elements 110-118 as electrically large as is reasonably feasible in order that the transmission line characteristic impedance have a value near the center or upper end of the 10-100 ohm expected range. Higher characteristic impedances are easier to drive electrically with the gate voltage swing required for charge transfer device gate pulses since drive voltage and drive current are directly related by Ohm's law.

The capacitors 128 and 130 in FIG. 1 indicate symbolically the need, in a transmission line gate drive arrangement, for some form of compensation for operating variations in the effective electrical size of the capacitances 124 and 126—the capacitance of the gate electrode elements. As is known in the CCD art, the value of the electrical capacitance present at a CCD gate element varies with the charge being controlled by the gate element; in other words, the gate capacitance varies with the magnitude of the signal present at a particular gate element in a CCD. This variation in gate capacitance can of course be minimized by selecting small signal amplitudes for use in the FIG. 1 apparatus, however, large signal amplitudes are preferred in CCD devices because of the less than one hundred percent charge transfer efficiency between CCD cells and because of signal-to-noise considerations.

One arrangement for negating the effect of gate capacitance variations is of course to shunt each gate element with a constant capacitance of sufficient electrical value to swamp or make negligible the capacitance variations inherently present at the gate electrode elements. Swamping capacitance could be in the form of discrete electrical capacitances or, as is preferable in the case of an integrated circuit, provided by a MIS structure or some other capacitance arrangement. Typically in the case of swamping capacitance, the added capacitance would be in the order of 5 times the largest capacitance value attained by a gate element. As may be observed from recalling the above characteristic impedance equation, the addition of capacitance of this value is undesirable because of its effect in decreasing the characteristic impedance of the delay line—in addition to capacitance space requirements and other disadvantages. A preferred arrangement for achieving the capacitors 128 and 130 is described connection with FIG. 3 below.

Figure 2:
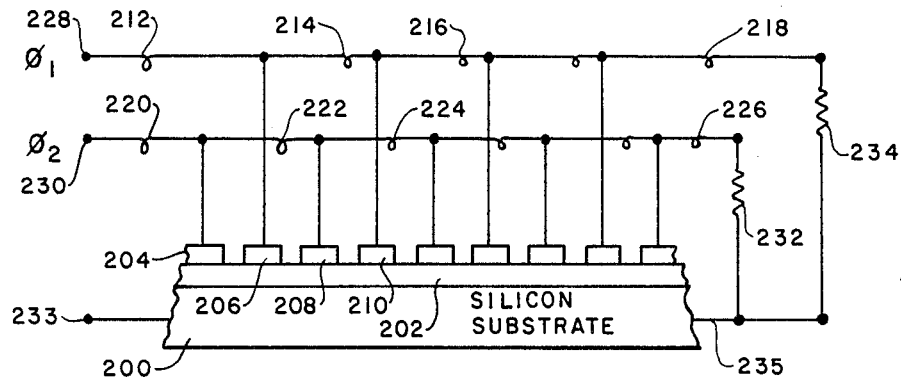
FIG. 2 shows a schematic embodiment of the FIG. 1 apparatus for a two-phase CCD clocking scheme.

An arrangement of the FIG. 1 apparatus which more closely resembles the structure to be employed in a CCD integrated circuit wafer is shown in FIG. 2 of the drawings. The FIG. 2 arrangement includes a semiconductor substrate member 200 which may be fabricated of, for example, suitably doped silicon; the substrate member 200 is covered by an electrical insulating layer 202 which may comprise a film of silicon dioxide. The electrical insulating layer 202 in turn, carries a series of CCD gate electrode elements 204, 206, 208, and 210 which are driven by a two-phase clock signal connected to the terminals 228 and 230. Inductance elements added to the FIG. 2 gate electrodes in forming a transmission line are shown at 212, 214, 216, and 218 for the phase 1 clock signal and at 220, 222, 224, and 226 for the phase 2 clock signal. The terminating resistances for the two clock lines are shown at 232 and 234 in FIG. 2. Common ground connections for the clock phase signals and the terminating resistances are shown at 233 and 235 in FIG. 2 and are indicated to comprise connections to the substrate 200, alternate grounding arrangements for these connections such as connection to an epitaxial layer located on the lower side of the substrate 200 or to a metal line or a package pin are also known in the integrated circuit art.

Operation of the FIG. 2 apparatus presumes that the clock phase signals applied at terminals 228 and 230 are displaced by one-half the clock period and that these phase-displaced signals operate in the usual step-by-step incremental manner of a CCD device in transferring charge packets between locations beneath the gates 204, 206, 208 and 210. The inductance elements 214-226 in FIG. 2 and the terminating resistances 232 and 234 together with appropriate terminating resistances immediately prior to the terminals 228 and 230 and not shown in FIG. 2, provide the transmission line characteristics described in connection with the FIG. 1 apparatus.

A two-phase or three-phase clock as suggested by the FIG. 2 apparatus is usually employed with a CCD device in preference to the single clock phase (virtual phase CCD) indicated in FIG. 1; additional clock phases such as a four-phase clock can, of course, be provided in the FIG. 2. arrangement.

If the inductance elements 212–226 are provided with an electrical inductance of 100 picohenries ($100 \times 10^{-12}$ Henry) and the gate electrodes 204–210 each have an electrical capacitance of 0.07 picofarads ($0.07 \times 10^{-12}$ farads) the characteristic impedance of each FIG. 2 transmission line will be in the order of 22 ohms and the delay time for each transmission line LC pair will be in the order of 4.6 picoseconds.

Delays of this magnitude are sufficiently small with respect to the expected operating cycle for each CCD cell, that is, each CCD gate element and related substrate area, as to make the delay difference observed between adjacent gate elements negligible within a local area. The signal delay from end to end of the FIG. 2 transmission lines may of course be excessive with respect to the timing required for CCD operation and if it were necessary to consider the relationship between such end located signals in the operation of a CCD a problem would exist. Since, however, relative gate timings within a given local area of a CCD wafer are the only time relationships of consequence in CCD operation, the presence of delays of the magnitude indicated above allows successful operation of the CCD within local areas and thereby successful operation of the entire CCD structure.

The inductance elements 212–226 in FIG. 2 may be fabricated in an integrated circuit embodiment of the CCD device using either semiconductor conducting elements such as polysilicon or using metal such as deposited aluminum or with combinations of semiconductor and metal conductors. In view of the currents required for capacitance charging in even the present transmission line arrangement of the gate electrode elements, inductance fabrication using deposited metal is preferred.

Delay line elements contemplating this metal or semiconductor fabrication could, of course, comprise a lumped parameter embodiment of the contemplated transmission lines. Other arrangements of these transmission lines such as a microstrip or strip line embodiments are also feasible in a FIG. 2 type apparatus. The following calculations, for example, show that the impedance of an integrated strip transmission line used in a FIG. 2 type embodiment would be in the order of 27 ohms.

Figure 3:
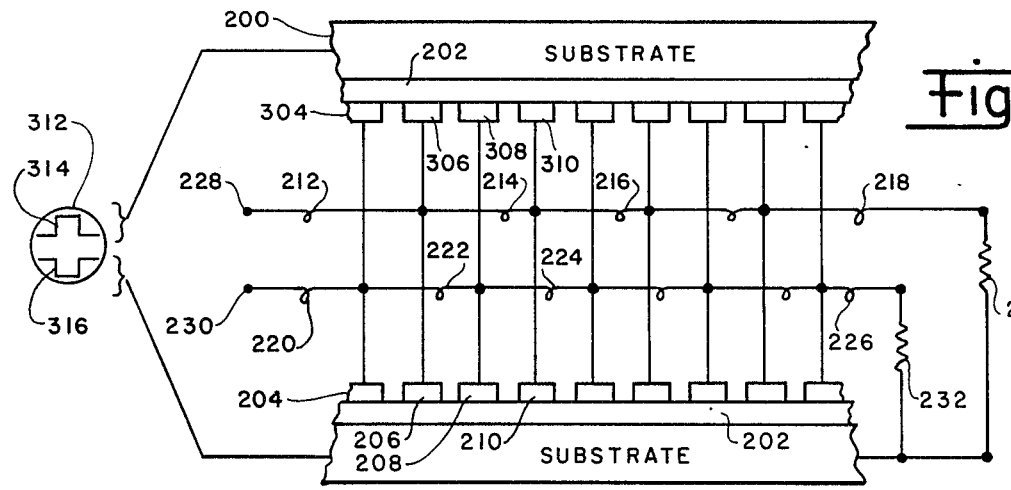
FIG. 3 shows the FIG. 2 embodiment of the apparatus together with the addition of a capacitance variation compensating arrangement.

$L = 0.00508 \, l \, (2.303 \log_{10}(4l/d) - 0.75)$ uH (where l is in inches)
if $l = 39.39$ inches—1 meter and
$d = 10$ um
$L = 2.6$ uH/Meter
$C = 0.07$ pf/20 um gate
$C = 0.07$ pf $\times 50,000 = 3.5$ nF/meter
$Z_o = \sqrt{L/C} = \sqrt{2600 \text{ uH/Meter}/3.5 \text{ nF/meter}} = \sqrt{744}$
$Z_o = 27.3 \Omega$ In FIG. 3 of the drawings there is shown a representation of the FIG. 2 embodiment of the invention, together with one arrangement for achieving the compensation for gate capacitance variations with signal amplitude that was described above. This compensation was indicated by the capacitors 128 and 130 in FIG. 1. In FIG. 3, the elements which are similar to FIG. 2 elements are shown with the same identifying numbers as in FIG. 2; elements which are new to FIG. 3 are identified with numbers in the three hundred series. The FIG. 3 apparatus includes a second CCD device fabricated on the same substrate, 200, and has the same insulating layer 202. The FIG. 3 apparatus includes a second series of gate electrodes 304, 306, 308, 310 which parallel the similarly numbered gate electrodes in the first series. FIG. 3 represents an embodiment of the concept that the charge controlled by the respective gate pairs 204 and 304, 206 and 306, and so on, and therefore the gate pair capacitance, is constant with respect to transferred signal amplitude. This constant charge is achieved by applying complementary signals from the input source 312 to the two CCDs illustrated in the substrate 200 that is, opposite polarity signals, as is shown by the pulse waveforms 314 and 316. In this complementary signal arrangement, the presence of a small charge packet below the gate electrode 210 is offset by the presence of a large charge packet under the gate electrode 310 so that essentially constant values of capacitance are available for use as a delay line capacitance element. It should be understood, of course, that the signal source 312 supplies the signals being delayed or propagated by the CCD devices in FIG. 3 as opposed to the clocking signals which are applied at terminals 228 and 230 and which cause propagation to occur.

Although the FIG. 3 compensating capacitance arrangement adds capacitance to each of the delay line LC pairs and this capacitance has the effect of lowering the delay line characteristic impedance according to the above-indicated equation; the capacitance added in the FIG. 3 arrangement is substantially less than the five times swamping capacitance indicated above for the capacitors 128 and 130. In the FIG. 3 arrangement total gate capacitances in the neighborhood of twice the capacitance of a single gate electrode are reasonable; capacitances of this value are clearly more desirable for determining the delay line characteristic impedance than are the previously described swamping capacitances. Isolation between the CCD devices in FIG. 3 may of course be realized through the use of isolation wells and channel stopping arrangements which are known in the integrated circuit art.

The terminating resistances at each end of the delay lines in the FIG. 1, FIG. 2 and FIG. 3 embodiments may be located either on-chip or external to the chip structure by way of pins or other connecting arrangements. The power to be dissipated in such terminating resistances is according to the $E^2/R$ power relationship 100/25 or 4 watts in the case of a 10 volt signal and a 25 ohm terminating resistance. Such power levels of course require more than casual consideration for dissipation. When locaated on-chip these terminating resistances can be fabricated from polysilicon, ion-implanted semiconductor material or doped semiconductor material or by using other resistance embodiments which are known in the integrated circuit art.

The signal source 312 and the source of clock signals connected to terminals 228 and 230 may also be located either on chip or external to the chip structure. External location of the clock signal sources connected at terminals 228 and 230 is preferable in view of the energy dissipation involved in providing the current needed for signal swings appropriate to a CCD device at transmission line characteristic impedance levels.

Figure 4:
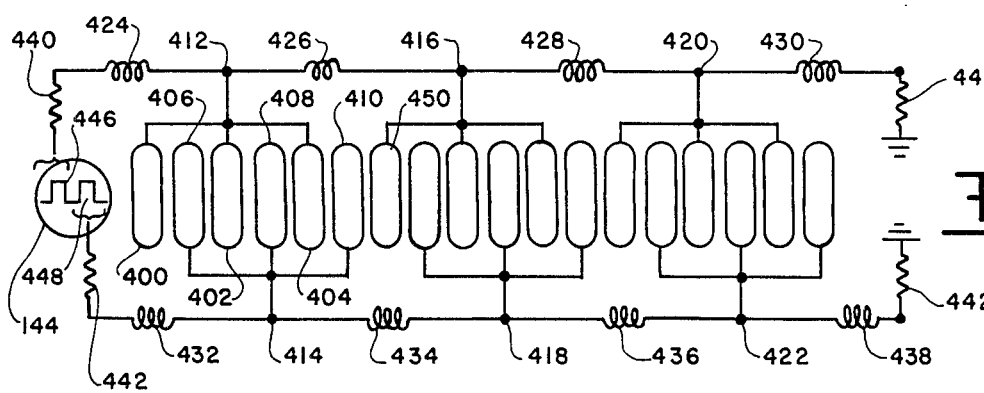
FIG. 4 shows an electrical schematic diagram of another transmission line arrangement according to the invention.

A modification of the FIG. 2 CCD apparatus is indicated schematically in FIG. 4 of the drawings. In FIG. 4, a series of CCD gate electrode elements 400, 402, 404 which are energized by one clock phase are shown to be connected in parallel and connected to a circuit node 412 that is located intermediate two of the delay line inductance elements 424 and 426 of one clock phase. Intermediate the CCD gate electrode elements 400–404 in FIG. 4 are located a second series of gate electrode elements 406, 408 and 410 which are connected to a second clock phase signal by way of inductance elements 432 and 434. Subsequent circuit nodes and inductance elements are shown at 416, 420, and 428, 430 respectively for the first clock phase and at 418, 422, and 436, 438 for the second clock phase in FIG. 4 together with the terminating resistances 440 and 442. As indicated by the signal 144 in FIG. 4, the FIG. 4 apparatus also contemplates the use of a two-phase clock having the pulse components 446 and 448.

The FIG. 4 embodiment of the invention is based on the computations shown above which indicate the time delay difference between two successive nodes such as the nodes 412 and 416 along a clock phase transmission line are small with respect to the CCD operating cycle time. This small delay time allows proper CCD operation between two adjacent gate electrodes 410 and 450 that are fed from different transmission line nodes in FIG. 4. In the FIG. 4 arrangement it is contemplated that the above-indicated 4.6 picoseconds delay be increased through the use of larger inductances at 424–438. The larger inductances which are fewer in number, however, than in FIGS. 1–3 embodiments for a given CCD array size are somewhat easier to realize physically in the space available on an integrated circuit chip structure.

The present invention is described in terms of employing the transmission line concept for use with CCD clock signals; such clock signals by way of being used in large areas of a CCD structure, provide one of the greatest needs for capacitive drive current minimizing. The transmission line technique may also be applied to other signals in a CCD device or to integrated circuit devices other than CCDs.

In summary, therefore, the achievment of improved charge transfer efficiency between the cells of CCD devices and improvements in integrated circuit manufacturing techniques has focused increasing attention on the CCD device for use in large array shift registers, image transducers, delay lines, and other electronic signal processing arrangements and has allowed the size of such CCD arrays to reach a point of affording some difficulty in providing clock signal drive capability. In many modern arrays the driven load has an effective capacitance impedance less than 1 ohm at the desired voltage change rate so that arrangements which allow higher clock bus impedance and reactive free resistance load driving of clock busses are desirable. With the present invention, clock bus impedances in the range of 10–100 ohms can be realized and these impedances can moreover be essentially resistive in nature; such loads are the most optimum for a clock driving circuit.

While the apparatus and method herein described constitute a preferred embodiment of the invention, it is to be understood that the invention is not limited to this precise form of apparatus or method, and that changes may be made therein without departing from the scope of the invention, which is defined in the appended claims.

What is claimed is:

1. Integrated circuit charge coupled device structure comprising:
   a plurality of charge coupled device cells disposed across the face of an integrated circuit chip, each cell including a gate electrode and an adjacent semiconductor depletion region potential well area, said cells being arranged in output to input ordered serial sequence capable of propagating received input signal transitions incrementally between cells, in shift register fashion, in respose to periodic clock signal transitions received at said gate electrode of each said cell;
   a source of said periodic transition clock signals coupled to a signal node on said integrated circuit chip;
   transmission means extending across the face of said integrated circuit chip and connecting with said signal node and said gate electrodes, said transmission means including a plurality of electrical inductance elements electrically located between successive gate elements in said cell serial sequence and comprising in combination with the electrical gate capacitance of said gate electrodes a signal transmission line having a characteristic impedance, Z;
   first electrical resistance means of resistance Z located at one end of said transmission line for terminating said transmission line in its characteristic impedance; and
   capacitance compensating elements located electrically between each of said transition means inductance elements for compensating the variations in capacitance occurring with signal level related variations of well charge at said gate electrode of said charge coupled device cells.

2. The apparatus of claim 1 wherein said plurality of charge coupled device cells includes:
   a first array of gate electrode and adjacent semiconductor depletion region potential well areas capable of propagating received input signal transitions incrementally between cells, in shift register fashion in response to periodic clock signal transitions received at said gate electrode of each said cell; and
   a second array of gate electrode and adjacent semiconductor depletion region potential well areas having corresponding gate elements thereof connected in parallel with respective gate elements in said first array, said second array cells receiving input signals complementary to the input signals received by said first array cells;

said second array gate elements comprising said capacitance compensating elements with the combined gate capacitance of a complemented signal second array gate element and a corresponding non-complemented signal first array gate element being substantially constant with complementary transitions of said input signals.

3. The apparatus of claim 1 wherein said capacitance means comprises a swamping electrical capacitance element connected in shunt with each said gate element and being of an electrical size large with respect to the capacitance of said gate element for swamping the varying capacitance of each said gate element with a larger capacitance that is substantially constnat for each gate element.

4. Charge coupled device integrated circuit structure comprising:

a first plurality of charge coupled device cells disposed across the face of an integrated circuit chip, each cell including a gate electrode and an adjacent semiconductor depletion region potential well area, said cells being arranged in all output to all input ordered serial sequence capable of propagating received input signal transitions incrementally between cells, in shift register fashion, in response to periodic clock signal transitions received at said gate electrode of each said cell;

a second plurality of charge coupled device cells corresponding respectively with said first plurality cells and connected with the corresponding first plurality gate electrodes, electrically isolated from said first plurality cells except for common gate electrode connections and disposed across the face of an integrated circuit chip, each cell including a gate electrode and an adjacent semiconductor depletion region potential well area, said cells being arranged in all output to all input ordered serial sequence capable of propagating received input signal transitions incrementally between cells, in shift register fashion, in response to periodic clock signal transitions received at said gate electrode of each said cell;

transmission line means extending across the face of said integrated circuit chip and connecting with said signal node means and said gate electrodes of said first and second pluralities, said transmission line means including a plurality of electrical inductance elements electrically located between successive pairs of connected first and second plurality gate elements in said cell serial sequence and comprising in combination with the electrical gate capacitance of said gate electrodes a signal transmission line having a characteristic impedance, Z;

first electrical resistance means of resistance Z located at one end of said transmission line for terminating said transmission line at its characteristic impedance;

a source of polarity complemented input signals connected with said first and second pluralities of charge coupled device cells, corresponding cells in said first and second pluralities containing thereby oppositely poled signals wherein the total signal amplitude in each pair of first and second plurality cells is substantially constant;

whereby the effective gate electrode capacitance of each successive pair of first and second plurality cells is substantially constant with respect to received signal amplitude excursions and thereby capable of comprising the capacitive element of an inductive-capacitive pair in said transmission line means.

* * * * *

UNITED STATES PATENT AND TRADEMARK OFFICE
CERTIFICATE OF CORRECTION

PATENT NO. : 4,610,019

DATED : September 2, 1986

INVENTOR(S) : Ernest S. Richards et al

It is certified that error appears in the above-identified patent and that said Letters Patent is hereby corrected as shown below:

At page 1, the first inventor's name should appear --Ernest S. Richards--.

At column 5, line 18, it should be shown that "½" is the exponent of the entire quantity L/C.

At column 7, line 64, the gap between "2600" and "µH", and the overlying square root symbol, should not exist.

At column 7, line 65, a closing parenthesis [)] should follow "meter".

At column 11, line 14, "constnat" should read --constant--.

At column 11, line 23, (claim 4), "all output to all" should read --cell output to cell--.

At column 12, line 1, (claim 4), "all output to all" should read --cell output to cell--.

At column 3, line 16, the text --device structure which includes a plurality of CCD cells disposed-- should follow "coupled".

Signed and Sealed this

Twenty-fourth Day of February, 1987

Attest:

DONALD J. QUIGG

Attesting Officer     Commissioner of Patents and Trademarks